United States Patent
Ramaswamy et al.

(10) Patent No.: US 9,659,751 B2
(45) Date of Patent: May 23, 2017

(54) SYSTEM AND METHOD FOR SELECTIVE COIL EXCITATION IN INDUCTIVELY COUPLED PLASMA PROCESSING REACTORS

(71) Applicant: APPLIED MATERIALS, INC., Santa Clara, CA (US)

(72) Inventors: Kartik Ramaswamy, San Jose, CA (US); Yang Yang, Sunnyvale, CA (US); Steven Lane, Porterville, CA (US); Lawrence Wong, Fremont, CA (US); Joseph F. Aubuchon, San Jose, CA (US); Travis Koh, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 33 days.

(21) Appl. No.: 14/341,492

(22) Filed: Jul. 25, 2014

(65) Prior Publication Data

US 2016/0027616 A1    Jan. 28, 2016

(51) Int. Cl.
*H01J 7/24* (2006.01)
*H01J 37/32* (2006.01)

(52) U.S. Cl.
CPC ...... *H01J 37/32165* (2013.01); *H01J 37/321* (2013.01); *H01J 37/3211* (2013.01); *H01J 37/32174* (2013.01)

(58) Field of Classification Search
CPC .................................... H01J 7/24; H01J 37/32
USPC ............. 315/111.21, 111.41, 111.51, 111.71, 315/111.91
See application file for complete search history.

(56) References Cited

U.S. PATENT DOCUMENTS

| 4,557,819 A | 12/1985 | Meacham et al. |
| 6,388,382 B1* | 5/2002 | Doi .................... H01J 37/32082 204/298.08 |
| 6,463,875 B1 | 10/2002 | Chen et al. |
| 6,508,198 B1 | 1/2003 | Hoffman et al. |
| 7,342,361 B2* | 3/2008 | Ellingboe ......... H01J 37/32082 118/723 I |
| 2010/0194281 A1* | 8/2010 | Carter .................... H01J 37/321 315/111.71 |
| 2012/0247679 A1* | 10/2012 | Yamazawa ........... H01J 37/3211 156/345.48 |

(Continued)

*Primary Examiner* — Tung X Le
(74) *Attorney, Agent, or Firm* — Moser Taboada; Alan Taboada

(57) ABSTRACT

Spatial distribution of RF power delivered to plasma in a processing chamber is controlled using an arrangement of primary and secondary inductors, wherein the current through the secondary inductors affects the spatial distribution of the plasma. The secondary inductors are configured to resonate at respectively different frequencies. A first secondary inductor is selectively excited to resonance, during a first time period within a duty cycle, by delivering power to a primary inductor at the resonant frequency of the first secondary inductor. A second secondary inductor is selectively excited to resonance, during a second time period within a duty cycle, by delivering power to a primary inductor at the resonant frequency of the second secondary inductor. The secondary inductors are isolated from one another and terminated such that substantially all current that passes through them and into the plasma results from mutual inductance with a primary inductor.

19 Claims, 4 Drawing Sheets

(56) References Cited

U.S. PATENT DOCUMENTS

2013/0307414 A1* 11/2013 Choi ................. H01J 37/32816
 315/111.51
2015/0380281 A1* 12/2015 Sriraman .......... H01L 21/32136
 438/710

* cited by examiner

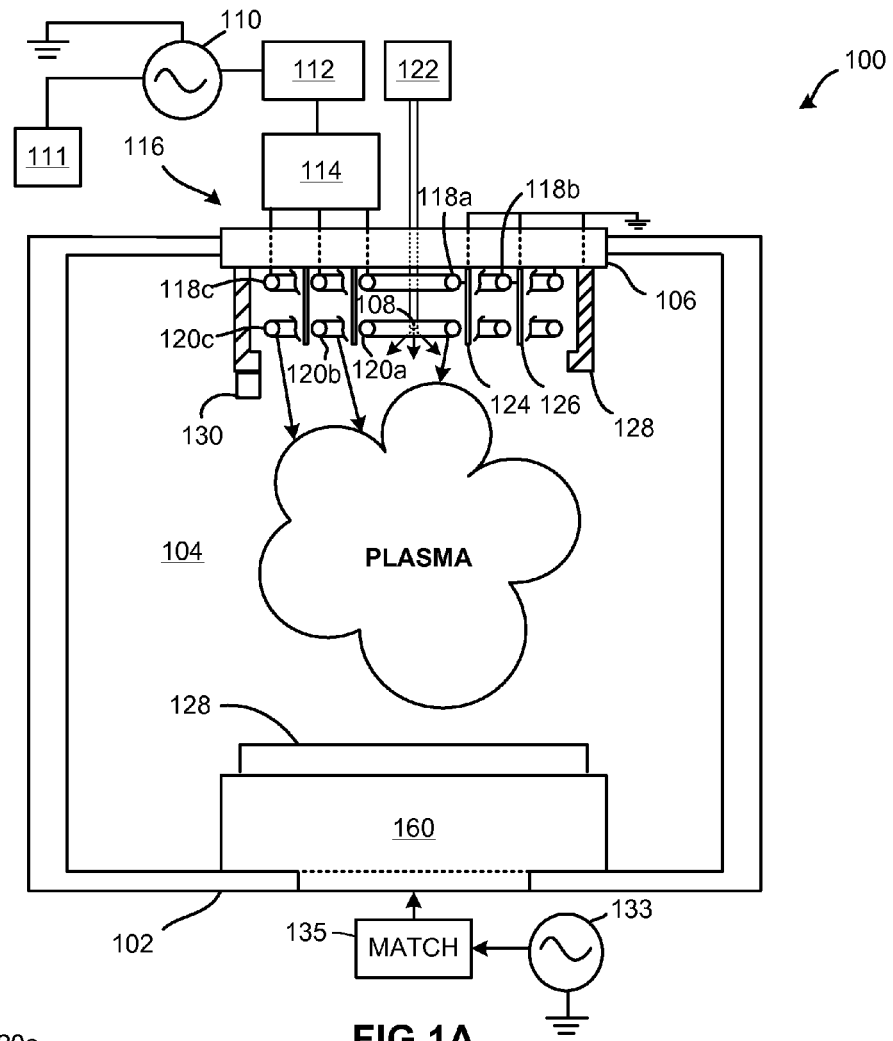
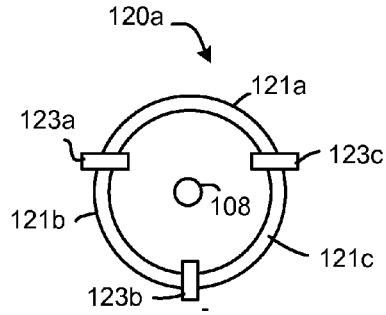
FIG 1B
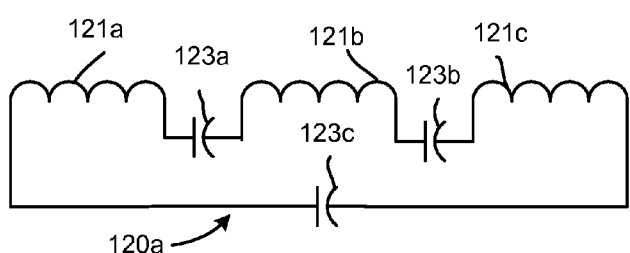
FIG 1C
FIG 1A

| Typical L/C Values for One Segment of Each Secondary Coil (5 Coil Arrangement) | | | |
| --- | --- | --- | --- |
| (From center to outer edge - smallest diameter to largest) | | | |
| COIL # | Resonant Freq (MHz) | L (micro Henry) | C (pF) |
| 1 | 12.9 | 0.1 | 1522.16 |
| 2 | 13.1 | 0.12 | 1230.03 |
| 3 | 13.56 | 0.15 | 918.40 |
| 4 | 13.8 | 0.20 | 665.05 |
| 5 | 14.2 | 0.25 | 502.49 |

SYSTEM AND METHOD FOR SELECTIVE COIL EXCITATION IN INDUCTIVELY COUPLED PLASMA PROCESSING REACTORS

FIELD

Embodiments of the present invention relate to inductively coupled plasma sources for semiconductor process chambers.

BACKGROUND

In a typical inductively coupled plasma processing reactor, radio frequency (RF) power is delivered to a processing gas within a processing volume. One or more coil antennas disposed on the top of a dielectric window are energized, and the RF energy is transferred to the gas to form a plasma A processing substrate such, for example, as a semiconductor wafer is mounted on the surface of a chuck to which a biasing RF voltage is applied.

When the foregoing approach is adapted to a chemical vapor deposition (CVD) chamber, a problem of undesirable variations—in the film formation upon the substrate surface—can develop if the spatial distribution of RF power to the plasma by the antenna is, itself, non-uniform. Still another problem is that the electrical components formed on the substrate suffer charging damage due to a non-uniform plasma density.

Therefore, the inventors have provided an improved method and apparatus for controlling the spatial distribution of the RF power being delivered to a plasma reactor.

SUMMARY

Embodiments of the present invention provide methods and apparatus for selective coil excitation in inductively coupled plasma processing reactors.

In some embodiments, a method for controlling spatial distribution of RF power delivered to plasma in a processing chamber includes exciting a first secondary inductor to resonance by inductively coupling RF power to the first secondary inductor at a resonant frequency of the first secondary inductor; exciting a second secondary inductor to resonance by inductively coupling RF power to the second secondary inductor at a resonant frequency of the second secondary inductor, and positioning each of the secondary inductors such that substantially all RF current that passes through each of the secondary inductors results from mutual inductance with a primary inductor, wherein RF current flowing through each of the secondary inductors controls the spatial distribution of the plasma.

In some embodiments, a plasma reactor includes a reactor chamber including a substrate support for holding a substrate for processing and a process gas supply inlet; an RF generator operative to generate and supply RF power at a selectable frequency within a range of frequencies; one or more primary inductors, each having one or more turns and being electrically coupled to the RF generator; and a plurality of secondary coils, each having one or more turns and being configured to resonate at a corresponding resonant frequency falling within the range of frequencies.

In some embodiments, the RF generator may be configured during a first time period to deliver RF power to a primary inductor at the resonant frequency of a first secondary inductor. The RF generator may further be configured during a second time period to deliver RF power to a primary inductor at the resonant frequency of a second secondary inductor.

In some embodiments, a plasma reactor comprises a reactor chamber which defines a processing volume, a process gas supply inlet in fluid communication with the processing volume, and a substrate support for holding a substrate for processing. The plasma reactor further comprises an RF generator operative to generate and supply RF power at a selectable frequency within a range of frequencies. In one or more embodiments, the plasma reactor includes a plurality of inductor pairs, each inductor pair including a single turn primary inductor electrically coupled to the RF generator and a single turn secondary inductor, wherein the secondary inductor of a first inductor pair is configured to resonate at a first resonant frequency falling within the range frequencies, and wherein the secondary inductor of a second inductor pair is configured to resonate at a second resonant frequency falling within the range of frequencies.

In some embodiments, the duration at which RF power is applied to each secondary inductor at its respective resonant frequency is varied as necessary to obtain a desired processing rate distribution across the substrate. To this end, the RF generator is configured during a first duty cycle to supply RF power to the primary inductor of the first pair at the first resonant frequency; and the RF generator is configured during a second duty cycle to supply RF power to the primary inductor of the second pair at the second resonant frequency. Each of the first and second inductor pairs are arranged within the reactor chamber such that substantially no RF energy is transferred by a primary inductor to plasma within the reactor chamber and substantially all RF current that passes through a secondary inductor over an applicable period of the duty cycle is transferred to plasma, and wherein the RF current transferred by each of the secondary inductors affecting a spatial distribution of the plasma.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 1A depicts a schematic side view of an inductively coupled plasma reactor, utilizing a plurality of selectively excitable secondary inductors to control the spatial distribution of RF energy to the reactor, in accordance with some embodiments of the present invention.

FIG. 1B depicts a top plan view of a selectively excitable secondary inductor comprising multiple segments arranged in a ring configuration, with each segment being coupled to two adjacent segments by a capacitor in accordance with some embodiments of the invention.

FIG. 1C depicts an electrical schematic equivalent of the selectively excitable secondary inductor depicted in FIG. 1B.

Figure 2:
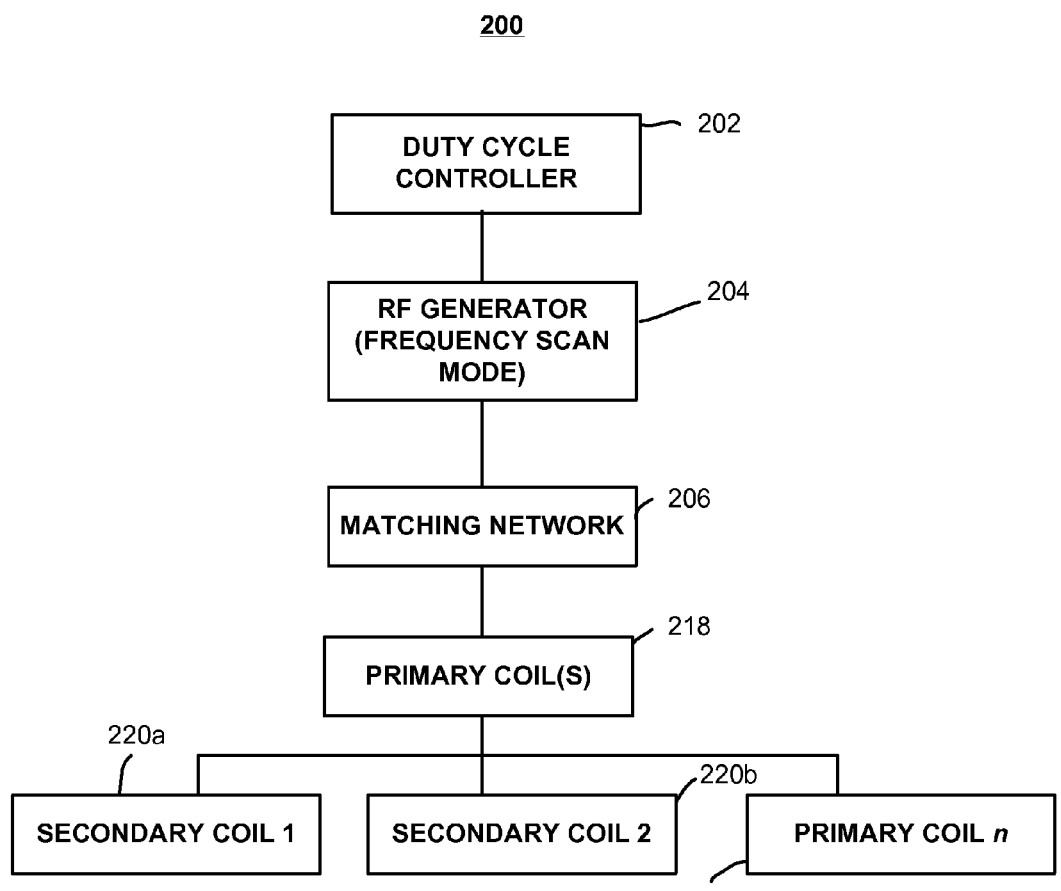
FIG. 2 depicts a block schematic diagram of the functional components of a control system for selectively exciting respective secondary inductors in accordance with one or more embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention may advantageously enhance the uniformity of power deposition across a processing substrate in an inductively coupled reactor. A typical commercial RF generator operates within a certain frequency range that may be, for example, within a frequency range of 5% below and 5% above a nominal center frequency. In some embodiments, a single generator feeds one or more primary inductor coils to selectively couple RF energy to a set of secondary coils. Each of the secondary coils is configured to resonate at a particular resonant frequency that is different from the resonant frequency of the other secondary coils of the set yet within the frequency range of the RF generator. When the RF generator is operated to produce RF energy at the particular resonant frequency of one of the secondary coils, the secondary coil has a higher coupling efficiency to the applicable primary inductor coil and is therefore selectively excited. As a result, more RF power is locally delivered to the plasma. According to embodiments, the process rate distribution across a substrate is controlled by controlling the amount of time each secondary inductor coil is operated at its resonant frequency.

The inventors herein have observed that the above-described arrangement overcomes the complexities and drawbacks associated with the use of a conventional antenna coil to couple RF power into plasma. One such drawback is that a traditional antenna coil design provides no control over the spatial distribution of the RF power being delivered to the reactor. While it is possible to use a densely packed arrangement of antenna coils and separate generators to obtain a finer degree of control than one or two larger antenna coils, such a configuration can lead to a characteristically non-uniform processing pattern due to constructive and/or destructive interference between antenna coils. To compensate, other process parameters such as electrode gap, pressure, and feedstock gases composition must often be manipulated. In addition to adding complexity to the process, such adjustments can be imprecise, can cause significant changes in plasma properties, and can lead to unpredictable final substrate process results.

FIG. 1A depicts a schematic side view of an inductively coupled plasma reactor 100 (ICP reactor), utilizing a plurality of selectively excitable secondary inductors to control the spatial distribution of RF energy to the reactor, suitable for performing embodiments of the present invention. The ICP reactor 100 may be utilized alone or, as a processing module of an integrated semiconductor substrate processing system, or cluster tool, such as a CENTURA® integrated semiconductor substrate processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. For example, suitable exemplary plasma reactors that may be utilized with the inventive methods disclosed herein are further described in U.S. patent application Ser. No. 12/821,609, filed Jun. 23, 2010 by V. Todorow, et al., and entitled, "INDUCTIVELY COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY."

The reactor 100 generally includes the process chamber 102 having a conductive body (wall), and a dielectric lid 106 (that together define a processing volume 104), a substrate support pedestal 160 disposed within the processing volume to support a substrate 128, an inductive plasma source 116, and a controller 111. In some embodiments, the dielectric lid 106 may be substantially flat. Other modifications of the process chamber 102 may have other types of lids such as, for example, a dome-shaped lid or other shapes. In the exemplary embodiment of FIG. 1, inductive plasma source 116 includes a cylindrical shower head assembly 128 which depends downwardly from or through the lid 106 and houses a concentric arrangement of primary RF inductors 108a, 108b, and 108c and a concentric arrangement of secondary RF inductors 120a, 120b, and 120c, the latter being configured to inductively couple RF power into the process chamber 102.

The inductive plasma source 116 is disposed atop the process chamber 102 so that the secondary inductors 120a-c are situated within the processing volume 104. The inductive plasma source 116 further includes an RF feed structure for coupling an RF power supply 110 to the primary RF inductors as primary RF inductors 118a, 118b, and 118c. In an embodiment, each of the plurality of primary RF inductors comprises a single coil, with the respective coils being concentrically nested, one within the other, and coaxially disposed proximate the process chamber 102 (for example, above, within or below the lid 106 of the process chamber 102). Each is electrically coupled to the RF generator 110 via a match network 112.

In some embodiments, a power divider 114 may be provided to adjust the RF power respectively delivered to the primary RF inductors 118a-c. In the embodiment of FIG. 1A, the power divider 114 is coupled between the match network 112 and the RF feed structure. Alternatively, the power divider may be a part of the match network 112, in which case the match network will have x outputs coupled to the RF feed structure—where x is the number of primary RF inductor coils fed by a single generator as generator 110. The RF power supply 110 may illustratively be capable of producing up to about 4000 W (but not limited to about 4000

W) at a tunable frequency centered within a range centered at 13.56 MHz, although other frequencies and powers may be provided as desired for particular applications. A second RF supply 133 and matching network 135 applies a biasing voltage to the pedestal so that RF.

According to some embodiments, the RF power supply 110 is operative in a frequency scanning mode under the control of controller 111. Within each scanning cycle, RF power at a respective frequency is supplied to one or more of the primary inductor coil(s) for the duration of a corresponding secondary inductor duty cycle $t_n$, where n corresponds to the number of resonant frequencies needed at which a corresponding secondary inductor or set of secondary inductors is selectively excited to resonance. For example, during that portion of the scanning cycle when RF power is supplied to primary inductors 118a, 118b, and 118c at the resonant frequency of secondary inductor 120a, a higher coupling efficiency will be obtained between primary inductor 118a and secondary inductor 120a than is obtained between primary inductor 118b and secondary inductor 120b or between primary inductor 118c and secondary inductor 120c. Likewise, during that portion of the scanning cycle when RF power is supplied to the primary inductors 118a-c at the resonant frequency of secondary inductor 118b, the greatest coupling efficiency is obtained between primary inductor 118b and secondary inductor 120c. To minimize unpredictable destructive and/or constructive interference between secondary inductors, a concentric arrangement of grounded isolation cylinders, indicated generally at reference numerals 124 and 126, are incorporated into the design of showerhead 128.

Before proceeding, it should be emphasized that the arrangement of primary and secondary coils is not limited to the nested concentric arrangement shown in FIG. 1A. In other embodiments, the respective primary and secondary inductors may be arranged to cover discrete, non-coaxial regions relative to the lid 106 and/or substrate 128—the primary objective at all times being to obtain the desired spatial distribution of RF power within the volume 104 and, thus, a reliable and repeatable processing rate distribution across the substrate 128. In yet another embodiment consistent with the foregoing objective, three coaxial and concentrically nested one-turn secondary inductors may be surface mounted on lid 106 and fed by a three turn primary "feeder" coil sitting above them above lid 106. The size of the feeder coils need not be larger than all of the secondary inductor coils, and the size and in some embodiments, the position of the primary feeder coil(s) is/are adjusted so as to have minimum coupling to the processing plasma.

It suffices to say that if it is desired to use the fewest number of RF generators (i.e., as few as one), then the frequency range to which RF power supply 110 is tunable must encompass all of the resonant frequencies to which the respective secondary coils are tunable. Taking into account the operating characteristics of commercially available RF generators, the dimensions of and operating conditions within processing volume 104 of reactor 100, and the number of secondary inductors to be used, the resonant frequency of each secondary inductor is obtained in some single turn embodiments by forming each secondary inductor from capacitively coupled segments of electrically conductive material.

FIG. 1B depicts a top plan view of a selectively excitable secondary inductor comprising multiple segments arranged in a ring configuration, with each segment being coupled to two adjacent segments by a capacitor in accordance with some embodiments of the invention. As shown in FIG. 1B, for example, secondary inductor 120a is formed by dividing a conductive wire into three equal sections 121a, 121b and 121c, wherein each section has the same characteristic inductance, The three segments are connected, end to end, using appropriate capacitors 123a, 123b, and 123c. The electrical equivalent of the arrangement of FIG. 1B is shown in FIG. 1C. Implementing the secondary inductors as a single turn coil minimizes conductor length and thus minimizes $I^2R$ power losses. It will, however, be readily appreciated by those skilled in the art that a larger number of multiple segmented, capacitively coupled coils may be employed without departing from the spirit an scope of the teachings embodied herein.

Returning briefly to FIG. 1A, the secondary coils are operated so as to inductively couple RF power into process chamber 102, and a process supply gas is introduced (for example, via a gas source 122 coupled to one or more gas inlets 108 of showerhead 108e or the like). This results in the formation of a plasma having the desired RF spatial profile. The relative position, ratio of diameters of each coil, and/or the number of turns in each coil can each be adjusted as desired to control, for example, the profile or density of the plasma being formed via controlling the inductance on each coil. In the embodiment of FIG. 1, a single turn coil is used for each primary and secondary RF inductor, and there is a 1:1 correspondence between the number of primary RF inductor coils and the number of secondary RF inductor coils. In an alternative embodiment, the primary inductor is formed from a multiple turn segment of conductive material where the number of turns is sufficient to provide the appropriate coupling of RF power to some or all of the secondary inductors.

The controller 111 comprises a central processing unit (CPU), a memory, and support circuits for the CPU and facilitates control of the components of the reactor 100 and, as such, of methods of processing a substrate, such as discussed herein. The controller 111 may be one of any form of general-purpose computer processor that can be used in an industrial setting for controlling various chambers and sub-processors. The memory, or computer-readable medium, of the CPU may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry and subsystems, and the like. The memory stores software (source or object code) that may be executed or invoked to control the operation of the reactor 100 in the manner described below. Specifically, memory stores one or more embodiments of the methods disclosed herein, such as the method 400 discussed above. The software routine may also be stored and/or executed by a second CPU (not shown) that is remotely located from the hardware being controlled by the CPU.

FIG. 2 depicts a block schematic diagram of the functional components of a control system 200 for selectively exciting respective secondary inductors in accordance with one or more embodiments. The control system 200 includes a duty cycle controller 202 electrically coupled to an RF generator 204 configured to operate in frequency scan mode. RF power is supplied by the RF generator 204 to a matching network 206 and, in turn, to one or more primary coils 218. Power is then inductively coupled to the secondary inductors ("coils") 1-n, indicated at reference numerals 220a, 220b, and 220c, respectively in FIG. 2.

From the description above, it will be recalled that respective secondary inductor coil within the processing volume of a plasma reactor are selectively excited to resonance for a time period of selectable duration. For purposes of illustration, the resonant frequency of secondary inductor coil 1 is $\omega_1$, the resonant frequency of secondary inductor coil 2 is $\omega_2$, and the resonant frequency of secondary inductor coil n is $\omega_n$. During a first time period, duty cycle controller 202 causes RF generator 204 to operate at the resonant frequency $\omega_1$. Because the coupling efficiency to any given secondary coil is greatest at its resonant frequency, most or all RF power is supplied from the primary inductor to the first secondary inductor coil during the first time period, according to some embodiments.

As a non-limiting example, consider the embodiment of FIG. 1A, which depicts a nested, concentric arrangement of three secondary inductors 120a, 120b and 120c. Assigning secondary inductor coils 1, 2 and n of FIG. 2, respectively, to secondary inductors 120a, 120b and 120, secondary inductor coil 1 is the innermost secondary inductor coil corresponding to and aligned with a central region of a substrate, secondary inductor coil n is an outermost coil corresponding to and aligned with an annular edge region of the substrate, and secondary inductor coil 2 is an intermediate secondary inductor coil corresponding to and aligned with an annular region disposed somewhere between the center and the edge regions.

For the duration of the first time period, at which time the RF generator is operated at RF frequency $\omega_1$, more power will be coupled to the center of the reactor—thereby increasing the local processing rate at the center of the substrate. For the duration of the second time period, at which time the RF generator is operated at RF frequency $\omega_2$, more power will be coupled to the intermediate region of the plasma zone—thereby increasing the local processing rate within the intermediate region of the substrate. For the duration of the nth time period, at which time the RF generator is operated at RF frequency $\omega_n$, more power will be coupled to the edge region of the plasma zone—thereby increasing the local processing rate within the edge region of the substrate. Should it become necessary or desirable to increase the processing rate within the intermediate region of the substrate relative to the other regions, then the duration of the second time period can be increased—at the expense of the first and nth time periods.

According an embodiment, for a given process requirement, software used for operating duty cycle control 202 determines the temporal fractions for selective excitation of each secondary inductor coil. Then, the total processing time is divided into a number of discrete processing periods or duty cycles. During each complete duty cycle, the duty cycle control 202 operates RF generator 204 at each respective resonant frequency $\omega_1$ to $\omega_n$, according to the determined temporal fractions. In an embodiment, the average duration at which each of the secondary inductor coils is selectively excited is chosen and implemented by the duty cycle controller 202 so as to produce the desired substrate processing pattern. A controllable processing rate across an entire substrate is thus achieved in a simple, intuitive way—using as few as a single RF generator and matching network to obtain the desired result.

Figures 3A, 3B:
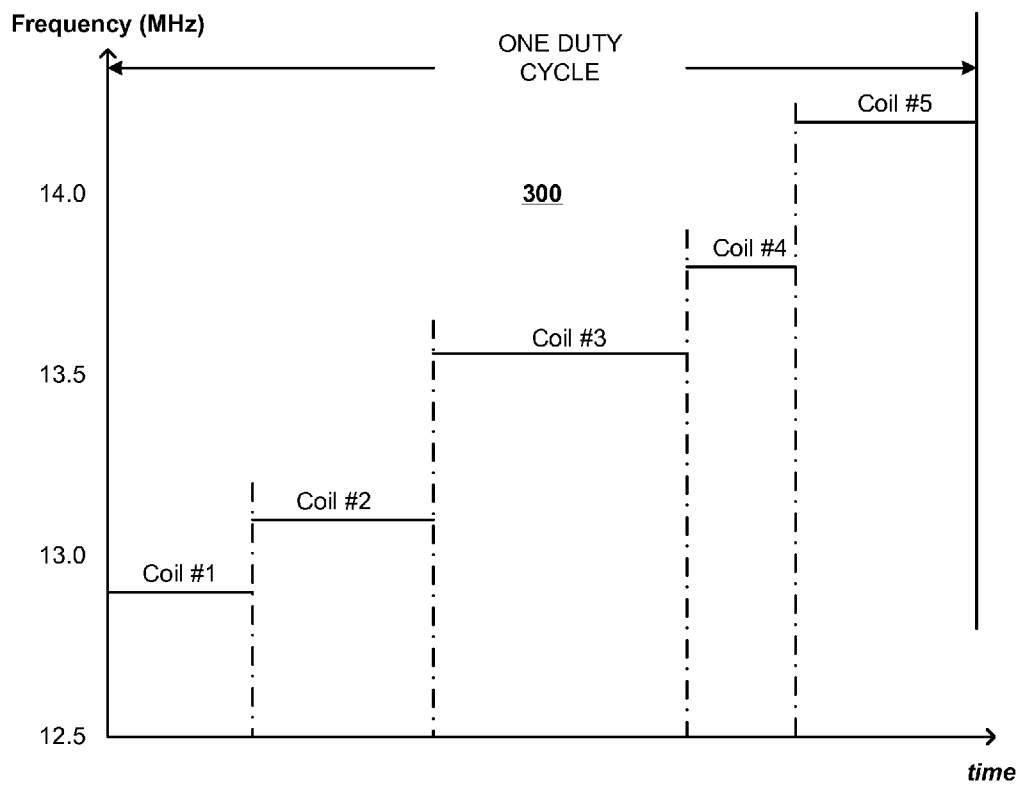
FIG. 3A depicts a tabular representation of inductance and capacitance values for an arrangement of segmented, selectively excitable secondary inductors in an inductively coupled plasma reactor, in accordance with at least some embodiments of the of the present disclosure.
FIG. 3B depicts the respective duration at which each of the secondary inductors depicted in FIG. 3B are operated at resonant frequency during an exemplary duty cycle, according to one or more embodiments.

FIG. 3A depicts a tabular representation of inductance and capacitance values for an arrangement of segmented, selectively excitable secondary inductors in an inductively coupled plasma reactor, in accordance with at least some embodiments of the of the present disclosure. As can be seen in FIG. 3A, all of the values for the illustrative embodiment have been chosen so that a single, tunable RF generator centered at 13.56 MHz can meet the resonant frequency requirements of an exemplary five single turn coil, secondary inductor arrangement wherein each coil comprises three segments having a characteristic inductance L and these are electrically coupled end to end in a circular pattern by an equal number of capacitors having a capacitance value C.

FIG. 3B depicts the respective duration at which each of the secondary inductors depicted in FIG. 3B are operated at resonant frequency during an exemplary duty cycle, according to one or more embodiments. As seen in FIG. 3B, a complete duty cycle encompasses a plurality of temporal fractions or time periods, each corresponding to a duration at which a corresponding one of a set of secondary inductors is selectively excited at its corresponding resonant frequency. Over the course of a process, the duration of any one time period may be increased or reduced, either as part of an a priori determination or in response to a spatial RF power distribution feedback provided by one or more sensors as sensor 130 of FIG. 1A.

Figure 4:
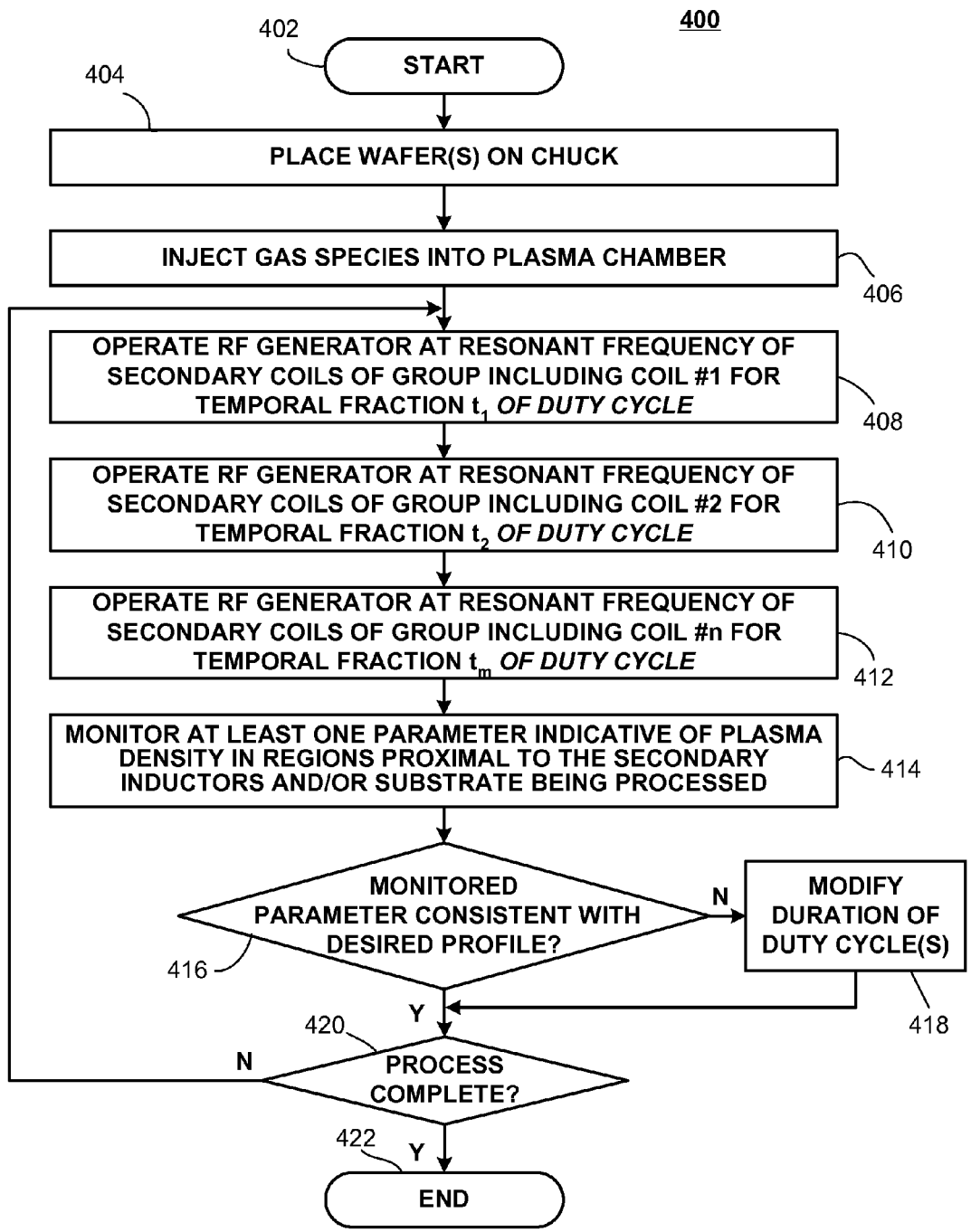
FIG. 4 is a flow diagram depicting a process for obtaining a desired processing rate distribution across a substrate by selectively exciting secondary inductors of an inductively coupled plasma reactor, according at least some embodiments of the present disclosure.

FIG. 4 is a flow diagram depicting a method 400 for obtaining a desired processing rate distribution across a substrate by selectively exciting secondary inductors of an inductively coupled plasma reactor, according at least some embodiments of the present disclosure. The method 400 begins at 402 and proceeds to 404. At 404, a substrate is placed on a mounting chuck and inserted into the processing volume of a plasma reactor. The method then proceeds to 406.

At 406, a process supply gas such, for example, as a gas species used for etching semiconductor material or for deposition of material on selected areas of the substrate, is introduced into the processing volume. The method 400 then proceeds to 408, where an RF generator is operated—during a first temporal fraction (time period) $t_1$ of a duty cycle—the operation being at a frequency corresponding to the resonant frequency of one or more secondary inductors (coils) of a first group of secondary coils that includes at least secondary inductor coil #1. Each of the secondary coils of the first group is configured to inductively couple RF power to plasma in the processing volume of a plasma reactor. In embodiments, the RF power is transferred to each secondary coil of the first group of secondary coils by one or more primary coils electrically coupled to the RF generator. The method then proceeds to 410.

At 410, the RF generator is operated—during a second temporal fraction (time period) $t_2$ of the duty cycle—at a frequency corresponding to the resonant frequency of one or more secondary inductors (coils) of a second group of secondary coils that includes at least secondary inductor coil #2. Each of the secondary coils of the second group is configured to inductively couple RF power to the plasma within the plasma reactor processing volume. In embodiments, the RF power is transferred to each secondary coil of the second group of secondary coils by one or more primary coils electrically coupled to the RF generator. The method then proceeds to 412.

At 412, the RF generator is operated—during a nth temporal fraction (time period) $t_m$ of the duty cycle—at a frequency corresponding to the resonant frequency of one or more secondary inductors (coils) of a mth group of secondary coils that includes at least secondary inductor coil #n. Each of the secondary coils of the mth group is configured to inductively couple RF power to the plasma within the plasma reactor processing volume. In embodiments, the RF power is transferred to each secondary coil of the mth group of secondary coils by one or more primary coils electrically coupled to the RF generator. The method then proceeds to steps 414-418, which are optional.

At 414, the method 400 monitors at least one parameter indicative of plasma density in regions proximal to the secondary inductors from groups 1-$m$ and/or the substrate disposed within the processing volume of the plasma reactor. The method 400 then determines, at 416, whether the spatial density of the plasma or other parameter(s) monitored are consistent with a desired processing rate across the substrate. If not, then at 418 the method adjusts the duration of one or more temporal fractions within the generator duty cycle o obtain the desired profile. If, however, the method 400 determines at 416 that monitored parameters are consistent with the desired profile, then the method proceeds to 420.

At 420, the method determines whether the substrate processing operation is complete and, of so, the method 400 terminates at 422. If further processing is required, the method returns to 408 and the next consecutive duty cycle commences.

While the foregoing is directed to embodiments of the present disclosure, other and further embodiments of the disclosure may be devised without departing from the basic scope thereof.

The invention claimed is:

1. A method for controlling spatial distribution of RF power delivered to plasma in a processing chamber, comprising:
   exciting a first secondary inductor to resonance by inductively coupling RF power to the first secondary inductor at a resonant frequency of the first secondary inductor; and
   exciting a second secondary inductor to resonance by inductively coupling RF power to the second secondary inductor at a resonant frequency of the second secondary inductor,
   wherein each of the secondary inductors are arranged such that substantially all RF current that passes through each of the secondary inductors results from mutual inductance with a primary inductor,
   wherein RF power is delivered to the plasma by the secondary inductors with negligible contribution from a corresponding primary conductor during excitation of each secondary inductor to resonance,
   wherein RF current flowing through the secondary inductors by mutual inductance controls the spatial distribution of the plasma, and
   wherein each secondary inductor includes a plurality of inductor segments having a common length, an end of each inductor segment of a secondary inductor being coupled to an adjacent inductor segment of a same secondary inductor by a capacitor.

2. The method according to claim 1, wherein each secondary inductor has a single turn.

3. The method according to claim 2, wherein the first secondary inductor and the second secondary inductor are concentrically arranged.

4. The method according to claim 3, wherein each concentrically arranged secondary inductor is inductively isolated from each adjacent secondary inductor to minimize mutual inductive coupling therebetween.

5. The method according to claim 2, wherein each secondary inductor is paired with a corresponding, axially aligned primary inductor, and wherein each pair of primary and secondary inductors is configured to deliver RF power to the plasma within the processing chamber such that negligible contribution is made by the primary inductor of a pair while RF power is delivered to the plasma by a secondary inductor of a pair.

6. A method for controlling spatial distribution of RF power delivered to plasma in a processing chamber comprising:
   exciting a first secondary inductor to resonance by inductively coupling RF power to the first secondary inductor at a resonant frequency of the first secondary inductor;
   exciting a second secondary inductor to resonance by inductively coupling RF power to the second secondary inductor at a resonant frequency of the second secondary inductor, and
   sensing at least one parameter indicative of plasma density in regions proximal to the secondary inductors and adjusting at least one of a duration of a first time period during which the first secondary inductor is excited or of a duration of a second time period during which the second secondary inductor is excited,
   wherein each of the secondary inductors are arranged such that substantially all RF current that passes through each of the secondary inductors results from mutual inductance with a primary inductor, and
   wherein RF current flowing through the secondary inductors by mutual inductance controls the spatial distribution of the plasma.

7. The method of claim 6, including exciting a third secondary inductor to resonance by inductively coupling RF power to the third secondary inductor at a resonant frequency of the third secondary inductor.

8. The method of claim 7, further including sensing at least one parameter indicative of plasma density in regions proximal to the secondary inductors and adjusting a duration at which power at resonant frequency is delivered to at least one of the secondary inductors.

9. A plasma reactor, comprising:
   a reactor chamber including a substrate support for holding a substrate for processing and a process gas supply inlet;
   an RF generator operative to generate and supply RF power at a selectable frequency within a range of frequencies;
   one or more primary inductors, each having one or more turns and being electrically coupled to the RF generator; and
   a plurality of secondary coils, each having one or more turns and being configured to resonate at a corresponding resonant frequency falling within the range of frequencies,
   wherein the primary inductors and secondary coils are arranged so that RF power is delivered to a plasma within the reactor chamber by at least one secondary coil of the plurality of secondary coils during excitation of the at least one secondary coil through mutual inductance with the one or more primary inductors, and
   wherein the RF generator is configured during a first time period to deliver RF power to a primary inductor at the resonant frequency of a first secondary coil, and wherein the RF generator is further configured during a second time period to deliver RF power to a primary inductor at the resonant frequency of a second secondary coil.

10. The plasma reactor of claim 9, wherein negligible contribution is made by a primary inductor while RF power is delivered to the plasma by a corresponding secondary inductor.

11. The plasma reactor according to claim 9, wherein each secondary coil includes a plurality of inductor segments having a common length, each inductor segment of a secondary coil being coupled to an adjacent inductor segment by a capacitor.

12. The plasma reactor according to claim 9, wherein at least some of the plurality of secondary coils are concentrically arranged.

13. The plasma reactor according to claim 12, further including a grounded isolation wall between each concentrically arranged secondary coil, each isolation wall being configured to minimize mutual inductive coupling between adjacent secondary coils.

14. A plasma reactor, comprising:
- a reactor chamber including a substrate support for holding a substrate for processing and a process gas supply inlet;
- an RF generator operative to generate and supply RF power at a selectable frequency within a range of frequencies;
- one or more primary inductors, each having one or more turns and being electrically coupled to the RF generator;
- a plurality of secondary coils, each having one or more turns and being configured to resonate at a corresponding resonant frequency falling within the range of frequencies; and
- a sensor configured to monitor at least one parameter indicative of plasma density in regions proximal to the secondary coils,
- wherein the primary inductors and secondary coils are arranged so that substantially all RF power delivered to a plasma within the reactor chamber is delivered by at least one secondary coil of the plurality of secondary coils during excitation of the at least one secondary coil through mutual inductance with the one or more primary inductors.

15. The plasma reactor according to claim 14, wherein each secondary coil has a single turn.

16. A plasma reactor comprising:
- a reactor chamber including a substrate support for holding a substrate for processing and a process gas supply inlet;
- an RF generator operative to generate and supply RF power at a selectable frequency within a range of frequencies; and
- a plurality of inductor pairs, each inductor pair including a single turn primary inductor electrically coupled to the RF generator and a single turn secondary inductor, wherein the secondary inductor of a first inductor pair is configured to resonate at a first resonant frequency falling within the range of frequencies, and wherein the secondary inductor of a second inductor pair is configured to resonate at a second resonant frequency falling within the range of frequencies;
- wherein the RF generator is configured during a temporal fraction of a duty cycle to supply RF power to the primary inductor of the first inductor pair at the first resonant frequency;
- wherein the RF generator is configured during a second temporal fraction of a cycle to supply RF power to the primary inductor of the second inductor pair at the second resonant frequency; and
- wherein each of the first and second inductor pairs are arranged within the reactor chamber such that substantially no RF energy is transferred by a primary inductor to plasma within the reactor chamber and substantially all RF current that passes through a secondary inductor over an applicable period of the duty cycle is transferred to plasma, and wherein the RF current transferred by each of the secondary inductors controls a spatial distribution of the plasma.

17. The plasma reactor according to claim 16 including a sensor configured to monitor at least one parameter indicative of plasma density in the reactor chamber.

18. The plasma reactor according to claim 16, wherein the inductor pairs are concentrically arranged.

19. The plasma reactor according to claim 18, further including a respectively grounded isolation wall disposed between each concentrically arranged secondary inductor, each grounded isolation wall being configured to minimize mutual inductive coupling between adjacent secondary inductors.

* * * * *